United States Patent [19]
Suzuki et al.

[11] 4,414,515
[45] Nov. 8, 1983

[54] CR OSCILLATOR HAVING CONSTANT CURRENT CHARGING SOURCE

[75] Inventors: Yasoji Suzuki, Yokosuka; Kenji Matsuo, Kawasaki, both of Japan

[73] Assignee: Tokyo Shibaura Denki Kabushiki Kaisha, Japan

[21] Appl. No.: 205,629

[22] Filed: Nov. 10, 1980

[30] Foreign Application Priority Data

Nov. 22, 1979 [JP] Japan .............................. 54-150741

[51] Int. Cl.³ ...................... H03K 3/03; H03K 3/354
[52] U.S. Cl. .................................. 331/111; 331/143; 331/179; 331/DIG. 3
[58] Field of Search ............... 331/111, 108 D, 113 R, 331/143, DIG. 3; 330/277; 307/451

[56] References Cited

U.S. PATENT DOCUMENTS

| | | | |
|---|---|---|---|
| 3,732,506 | 5/1973 | Dupuy | 331/113 R X |
| 3,863,179 | 1/1975 | Goo | 331/111 X |
| 3,904,988 | 9/1975 | Hsiao | 331/111 |
| 4,115,748 | 9/1978 | Kubo et al. | 331/111 |
| 4,205,279 | 5/1980 | Beutler | 331/108 D X |
| 4,301,427 | 11/1981 | Suzuki et al. | 331/111 |

*Primary Examiner*—Siegfried H. Grimm
*Attorney, Agent, or Firm*—Finnegan, Henderson, Farabow, Garrett & Dunner

[57] ABSTRACT

A CR oscillation circuit is provided which includes inverters which are connected in series and whose operating current paths between a power source terminal and a ground terminal are connected in series with a constant current source. In certain embodiments, a resistor is connected between the output terminal of one inverter and the input terminal of the first inverter, and a capacitor is connected between the output terminal of another inverter and the input terminal of the first inverter. The CR oscillation circuit further has a constant current source connected in series with the operating current path of said inverters between the power source terminal and the ground terminal. In other embodiments, the resistor and capacitor are connected in parallel and to the input of an inverter.

13 Claims, 27 Drawing Figures

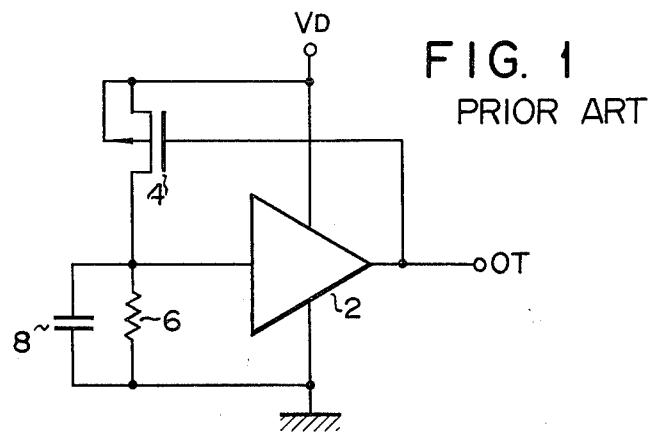
FIG. 1
PRIOR ART
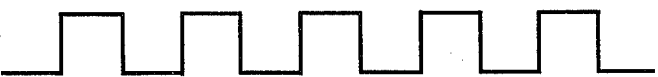
FIG. 2A
PRIOR ART
FIG. 2B
PRIOR ART
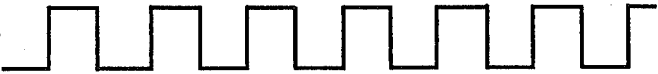
FIG. 2C
PRIOR ART
FIG. 3
PRIOR ART
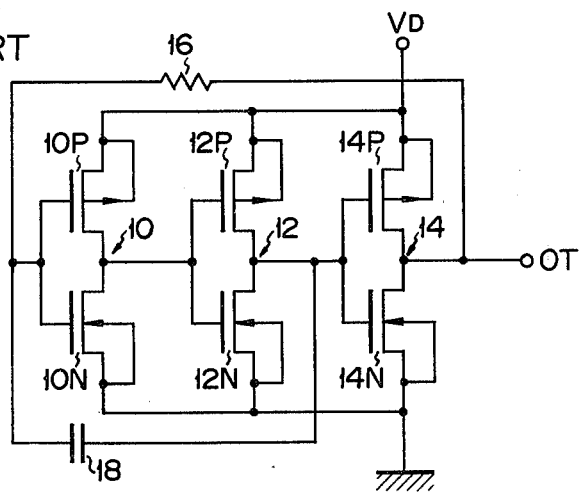

F I G. 12
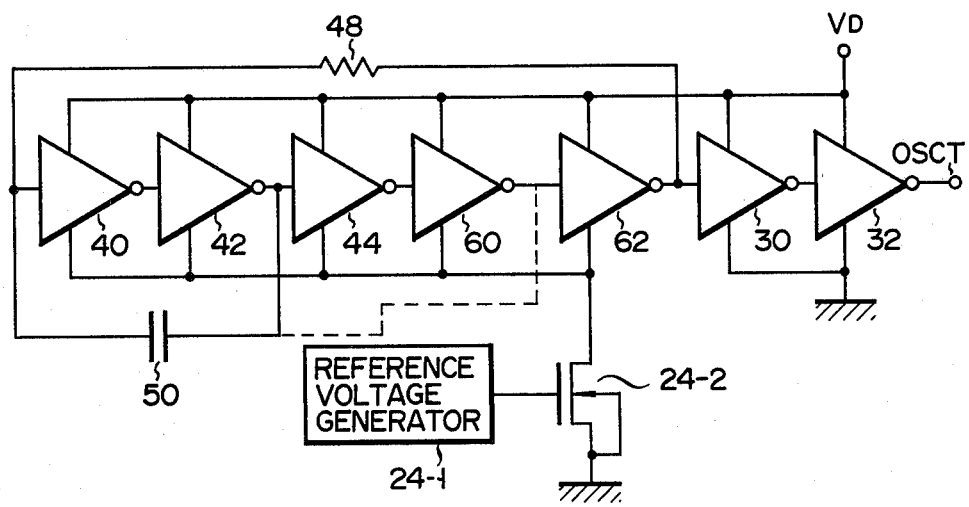
F I G. 13
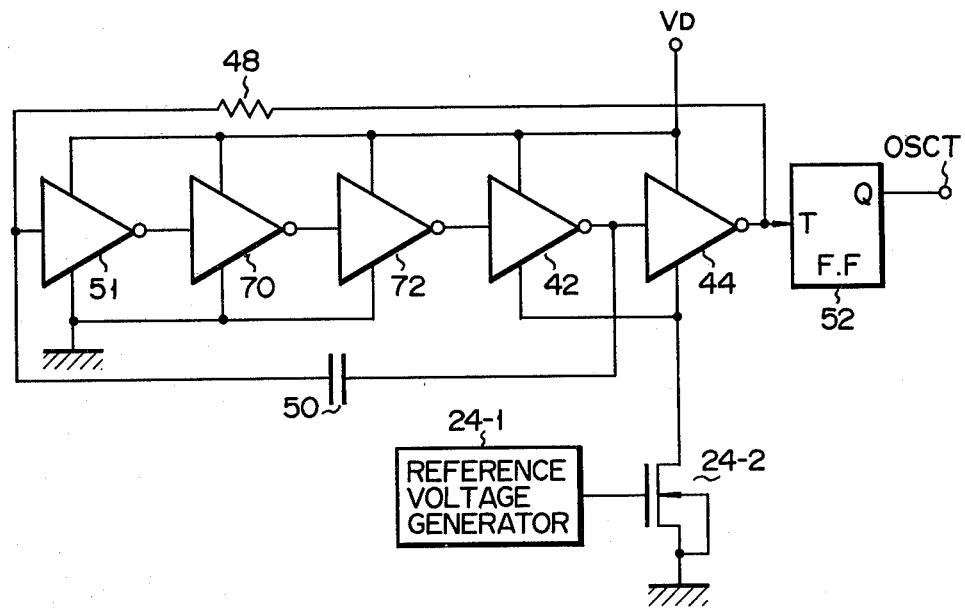

CR OSCILLATOR HAVING CONSTANT CURRENT CHARGING SOURCE

BACKGROUND OF THE INVENTION

The present invention relates to an oscillation circuit for oscillatory operations utilizing the charging and discharging function of a capacitor.

Various types of oscillation circuits have been conventionally proposed. For example, FIG. 1 shows one example of a well known conventional CR oscillation circuit. This oscillation circuit has an amplifier 2 for amplification of a voltage applied between a power source terminal $V_D$ and ground, a p— channel MOS transistor 4 whose current path is coupled between the power source terminal $V_D$ and the input terminal of the amplifier 2 and whose gate is coupled to the output terminal of the amplifier 2, a resistor 6 connected between the input terminal of the amplifier 2 and ground, and a capacitor 8 connected in parallel with the resistor 6.

Assume that an output signal of low level is generated at an output termimnal OT of the oscillation circuit shown in FIG. 1. In this case, the MOS transistor 4 is rendered conductive and the capacitor 8 is charged to the power source voltage level. The charging voltage of this capacitor 8 is amplified by the amplifier 2, and a voltage of high level is generated at the output terminal OT. Then, the MOS transistor 4 is rendered nonconductive and the charge stored on the capacitor 8 is discharged through the resistor 6. When the capacitor 8 is completely discharged, the input signal to the amplifier 2 becomes low level and an output signal of low level is generated again at the output terminal OT.

An oscillation output signal as shown in FIG. 2A is generated in this manner at the output terminal OT of the oscillation circuit shown in FIG. 1. When the voltage applied to the power source terminal $V_D$ is constant, the frequency of the oscillation output signal shown in FIG. 2A is constant since it is determined by the time constant which is defined by the resistor 6 and the capacitor 8. When the voltage applied to the power source terminal VD is low and the output signal of high level from the amplifier 2 is applied to the gate of the MOS transistor 4, the MOS transistor 4 has a large resistance of finite value. Thus, a small amount of charge is discharged from the power source terminal $V_D$ through the MOS transistor 4 and it takes a long time to completely discharge the charge on the capacitor 8 through the resistor 6.

When the MOS transistor 4 is rendered conductive by the output signal of low level from the amplifier 2, it takes a long time to charge the capacitor 8 to a predetermined level since the voltage applied to the power source terminal $V_D$ is low. When a voltage of low level is thus applied from the power source terminal $V_D$, an oscillation output signal of a lower frequency as shown in FIG. 2B is obtained.

To the contrary, when a higher voltage is applied from the power source $V_D$, the charging and discharging of the capacitor 8 is performed in a shorter period of time. In this case, an oscillation output signal of a higher frequency as shown in FIG. 2C is generated from the oscillation circuit.

The CR oscillation circuit shown in FIG. 1 is defective in that changes in the power source voltage $V_D$ results in changes in the oscillation frequency.

FIG. 3 shows another example of a conventional CR oscillation circuit. This oscillation circuit has three CMOS inverters 10, 12 and 14 connected in series. The CMOS inverter 10 includes, a p— channel MOS transistor 10P and an n— channel MOS transistor 10N which are connected in series between the power source terminal $V_D$ and ground. The CMOS inverter 12 includes a p— channel MOS transistor 12P and an n— channel MOS transistor 12N. The CMOS inverter 14 includes a p— channel MOS transistor 14P and an n— channel MOS transistor 14N. The output terminals of the CMOS inverters 14 and 12 are coupled to the input terminal of the CMOS inverter 10 respectively through a resistor 16 and a capacitor 18.

Assume now that the input signal to the CMOS inverter 10 changes to have a high level at a time t1 as shown in FIG. 4A for the oscillation circuit shown in FIG. 3. In this case, the MOS transistors 10P and 10N are rendered nonconductive and conductive, respectively, and a signal of low level as shown in FIG. 4B is generated from the CMOS inverter 10. In response to the output signal of low level from the CMOS inverter 10, the MOS transistors 12P and 12N are rendered conductive and nonconductive, respectively, and an output signal of high level as shown in FIG. 4C is generated from the CMOS inverter 12.

In response to the output signal of high level from the CMOS inverter 12, the MOS transistors 14P and 14N are rendered nonconductive and conductive, respectively, and an output signal of low level as shown in FIG. 4D is generated from the CMOS inverter 14. Under this condition, a discharging current flows through the MOS transistor 12P, the capacitor 8, the resistor 16 and the MOS transistor 14N and gradually decreases the level of the input signal to the CMOS inverter 10.

Thereafter, when the level of this input signal becomes lower than a circuit threshold voltage $V_{TH}$ of the CMOS inverter 10 at a time t2, the MOS transistors 10P and 10N are rendered conductive and nonconductive, respectively. Then, output signals of high, low and high levels as shown in FIGS. 4B, 4C and 4D are generated from the CMOS inverters 10, 12 and 14, respectively. Furthermore, since the MOS transistor 12N is conductive, the electrode of the capacitor 18 to which the power source voltage $V_D$ has been applied is forced to have a ground potential. The level of the input signal to the CMOS inverter 10 is instantaneously dropped from the level $V_{TH}$ to $(-V_D+V_{TH})$. Under this condition, a charging current flows through the MOS transistor 14P, the resistor 16, the capacitor 18, and the MOS transistor 12N. The capacitor 18 is thus gradually charged. When the level of the input signal to the CMOS inverter 10 becomes greater than the circuit threshold voltage $V_{TH}$ at a time t3 as shown in FIG. 4A, the MOS transistors 10P and 10N are rendered nonconductive and conductive, respectively.

In this case, since the MOS transistor 12P is rendered conductive, the power source voltage $V_D$ is applied to the electrode of the capacitor 18 which has been held at the ground potential. The level of the input voltage to the CMOS inverter 10 is raised from the level $V_{TH}$ to the level $(-V_D+V_{TH})$, and the operation as described above is repeated. An oscillation output signal as shown in FIG. 4D is generated at the output terminal OT of the oscillation circuit. Although the frequency of the oscillation output signal is determined by the time constant which is in turn defined by the resistor 16 and the capacitor 18, the frequency of the oscillation circuit also changes with variation in the power source voltage VD, as in the case of the oscillation circuit shown in FIG. 1.

SUMMARY OF THE INVENTION

It is, therefore, the primary object of the present invention to provide an oscillation circuit capable of oscillation with a stable frequency regardless of variation in the power source voltage.

According to one aspect of the present invention, there is provided an oscillation circuit which has an operation current path including a resistor means and a capacitive means constituting a time constant circuit in cooperation with the resistor means; and an oscillation circuit having a constant current source means connected in series with the operation current path of the oscillation circuit part.

BRIEF DESCRIPTION OF THE DRAWINGS

FIG. 1 is a circuit diagram of a conventional CR oscillation circuit;

FIGS. 2A to 2C are signal waveforms for explaining the operation of the oscillation circuit shown in FIG. 1;

FIG. 3 is a circuit diagram of another conventional CR oscillation circuit;

FIG. 12 is a circuit diagram of an oscillation circuit which is improved over the oscillation circuit shown in FIG. 7;

FIG. 13 is a circuit diagram of an oscillation circuit which is improved over the oscillation circuit shown in FIG. 9;

DETAILED DESCRIPTION OF THE PREFERRED EMBODIMENTS

Figure 4A:
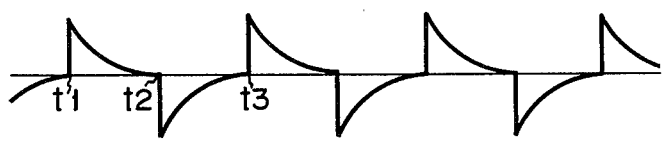
FIGS. 4A to 4D are signal waveforms for explaining the operation of the oscillation circuit shown in FIG. 3.
Figure 4B:
Figure 4C:
Figure 4D:
Figure 5:
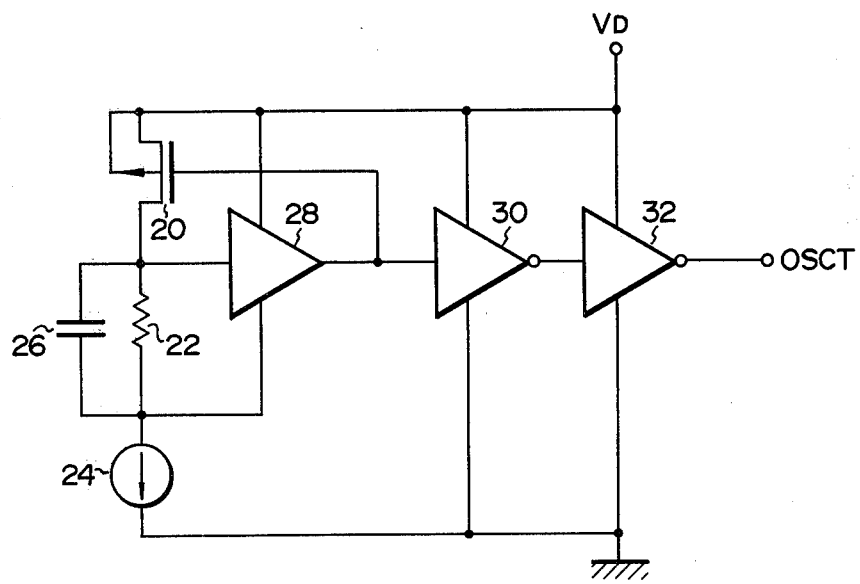
FIG. 5 is a circuit diagram of an oscillation circuit of an embodiment according to the present invention.

The CR oscillation circuit shown in FIG. 5 has a p—channel MOS transistor 20, a resistor 22 and a constant current source 24 which are connected in series between a power source terminal $V_D$ and ground. The CR oscillation circuit further has a capacitor 26 connected in parallel with the resistor 22, an amplifier 28 whose input terminal is coupled to the junction between the MOS transistor 20 and the resistor 22 and whose output terminal is coupled to the gate of the MOS transistor 20, an inverter 30 coupled to the output terminal of the amplifier 28, and an inverter 32 whose input terminal is coupled to the output terminal of the inverter 30 and whose output terminal is coupled to an oscillation output terminal OSCT. The positive and negative biasing terminals of the amplifier 28 are coupled to the junctions between the power source terminal $V_D$, and the resistor 22 and the current source 24, respectively. The biasing terminals of the inverters 30 and 32 are coupled to the power source terminal $V_D$ and ground. The inverters 30 and 32 may include CMOS inverters, for example, and they function as a waveform shaping circuit.

The operation of the CR oscillation circuit shown in FIG. 5 will now be described.

Assume that the capacitor 26 is fully charged and an input voltage of high level is supplied to the amplifier 28. In this case, an output voltage of high level is generated from the amplifier 28, the MOS transistor 20 is rendered nonconductive, and an output voltage of high level is generated by the inverter 32. When the MOS transistor 20 is rendered nonconductive, the voltage across the resistor 22 is significantly reduced and the capacitor 26 is discharged through the resistor 22. The level of the input voltage to the amplifier 28 gradually decreases according to the time constant defined by the resistor 22 and the capacitor 26.

When the input voltage to the amplifier 28 reaches a predetermined value, the MOS transistor 20 is rendered conductive in response to a low output voltage from the amplifier 28. Then, current flows from the power terminal $V_D$ through the MOS transistor 20 and the resistor 22, and the capacitor 26 is charged. When the capacitor 26 is charged to a high voltage, the MOS transistor 20 is again rendered nonconductive and the output voltage at the output terminal OSCT changes from low level to high level. An oscillation output signal similar to that shown in FIG. 2A is generated from the oscillation circuit shown in FIG. 5.

It is to be noted that the current flowing through the MOS transistor 20 and the resistor 22 from the constant current source 24 is held constant regardless of changes in the power source voltage $V_D$, as long as the MOS transistor 20 is conductive. Consequently, even when the power source voltage $V_D$ is decreased, for example, the mutual conductance of the MOS transistor 20 does not change, the voltage level charged on the capacitor C is constant, and the oscillation frequency of the oscillation circuit does not drop.

Figure 6:
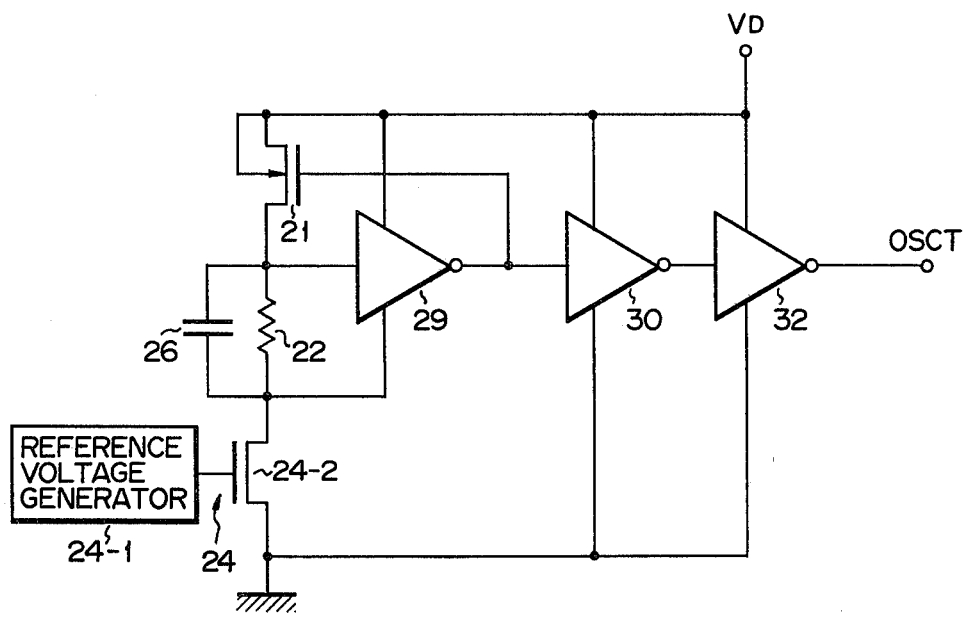
FIG. 6 is a circuit diagram of an oscillation circuit of another embodiment according to the present invention incorporating a parallel circuit of a resistor and a capacitor as in the oscillation circuit shown in FIG. 5.

FIG. 6 shows another embodiment of a CR oscillation circuit in accordance with the present invention. The oscillation circuit shown in FIG. 6 is substantially the same as that shown in FIG. 5, except that a CMOS inverter 29 is used instead of the amplifier 28 and an n—channel MOS transistor 21 is used instead of the p—channel MOS transistor 20. The oscillation circuit shown in FIG. 6 operates in substantially the same manner and provides the same effects as that shown in FIG. 5. In the oscillation circuit shown in FIG. 6, a constant current source 24 includes a reference voltage generator 24-1, and an MOS transistor 24-2 whose current path is coupled between the resistor 22 and ground and whose gate is coupled to the reference voltage generator 24-1.

Figure 7:
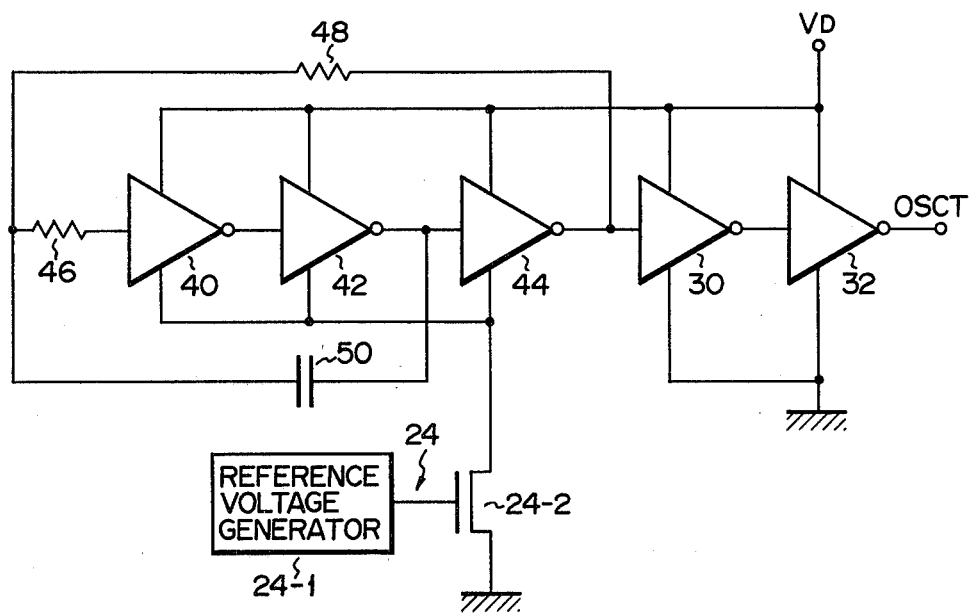
FIG. 7 is a circuit diagram of an oscillation circuit of another embodiment of the present invention incorporating a series circuit of a resistor and a capacitor.

FIG. 7 shows a CR oscillation circuit in accordance with still another embodiment of the present invention. This CR oscillation circuit has an oscillation part including three inverters 40, 42 and 44 which are connected in series, a resistor 46 with one end coupled to the input terminal of the inverter 40, a resistor 48 connected between the other end of the resistor 46 and the output terminal of the inverter 44, and a capacitor 50 connected between the other end of the resistor 46 and the output terminal of the inverter 42. The output signal of the oscillation part is supplied to a waveform shaping circuit including two inverters 30 and 32 which are connected in series.

Figure 8:
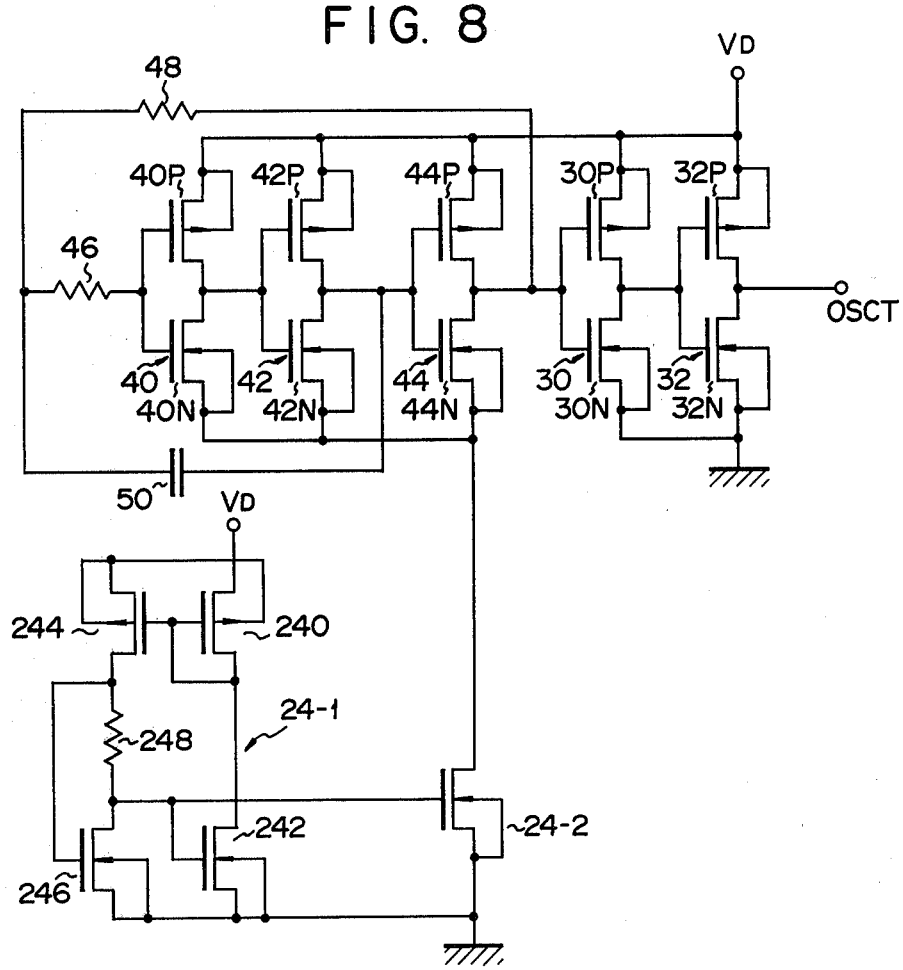
FIG. 8 is a circuit diagram illustrating a practical example of the oscillation circuit shown in FIG. 7.

As shown in FIG. 8, the inverters 30 and 32 include CMOS transistors 30P and 30N and CMOS transistors 32P and 32N, respectively whose current paths are connected in series between the power source terminal $V_D$ and ground. The inverters 40, 42 and 44 include CMOS transistors 40P and 40N, 42P and 42N, and 44P and 44N, respectively. The positive and negative biasing terminals of these inverters 40, 42 and 44 are coupled to the power source terminal $V_D$ and the current path of the n— channel MOS transistor 24-2 whose gate is coupled to the input terminal of the reference voltage generator 24-1. In this embodiment, the reference voltage generator 24-1 has a current mirror circuit. The reference voltage generator has p— and n— channel MOS transistors 240 and 242 whose current paths are connected in series between the power source terminal $V_D$ and ground, a p-type channel MOS transistor 244 whose source and gate are coupled to the source and gate of the p— channel MOS transistor 240, an n—channel MOS transistor 246 whose source is grounded and whose gate is coupled to the drain of the MOS transistor 244, and a resistor 248 connected between the drains of the MOS transistors 244 and 246. The junction of the drain of the MOS transistor 246 and the resistor 248 is coupled to the gates of the MOS transistors 242 and 24-2, and the gate of the MOS transistor 240 is coupled to its own drain.

In order that the current characteristics of the MOS transistor 24-2 in the embodiment shown in FIG. 8 remain constant, the following relation must be satisfied:

$$0 < Vg - V_{TH} < Vd$$

wherein Vg, $V_{TH}$ and Vd indicate the gate voltage, the threshold voltage and the drain voltage of the MOS transistor 24-2, respectively.

When the above relation is satisfied, a saturating current Is, as defined by the following equation and which is kept constant regardless of the changes in the power source voltage VD, flows through the MOS transistor 24-2:

$$Is = K(Vg - V_{TH})^2$$

wherein K is a constant.

In this case, the drain voltage Vd of the MOS transistor 24-2 is determined by the ratio of the mutual conductance of the MOS transistor 24-2 and the mutual conductance of the inverters 40, 42 and 44. Thus, it is possible for a saturation current flowing through the MOS transistor 24-2 to be kept constant regardless of the variation in the power source voltage VD by holding the ratio of the mutual conductance of the MOS transistor 24-2 and the mutual conductance of the inverters 40, 42 and 44 constant and by making up the reference voltage generator 24-1 with the current mirror as shown in FIG. 8 so as to apply a stable output voltage to the gate of the MOS transistor 24-2.

The operation of the oscillation circuits shown in FIGS. 7 and 8 will now be described.

Assume that the output signal of the inverter 42 becomes high level. Under this condition, the MOS transistors 40N, 42P and 44N are rendered conductive, and the MOS transistors 40P, 42N and 44P are rendered nonconductive. Thus, the current flows from the power source terminal $V_D$ to ground through the MOS transistor 42P, the capacitor 50, the resistor 48, and the MOS transistors 44N and 24-2. Then, the charging voltage of the capacitor 50 gradually decreases from its maximum high level.

When the charging voltage of the capacitor 50 reaches a predetermined low level, the CMOS transistors 40P and 40N of the inverter 40 are rendered conductive and nonconductive, respectively, and an output signal of high level is generated by the inverter 40. As a result, the MOS transistors 42N and 44P are rendered conductive and the MOS transistors 42P and 44N are rendered nonconductive, and an output voltage of high level is generated by the inverter 44.

When the MOS transistor 42N is rendered conductive, the charging voltage of the capacitor 50 decreases from its predetermined level to a minimum level. In this case, current flows from the power source terminal VD to ground through the MOS transistor 44P, the resistor 48, the capacitor 50, and the MOS transistors 42N and 24-2. When the capacitor 50 is charged and the voltage charged on the capacitor 50 increases from its minimum level to the predetermind level, the CMOS transistors 40P and 40N of the inverter 40 are rendered nonconductive and conductive, respectively, and an output voltage of low level is generated by the inverter 40. The MOS transistors 42P and 44N are rendered conductive, and the MOS transistors 42N and 44P are rendered nonconductive. Thus, output voltages of high and low levels are generated by the inverters 42 and 44, respectively, and the charging voltage of the capacitor 50 increases from its predetermined level to the maximum level due to conduction of the MOS transistor 42P.

The oscillation circuits shown in FIGS. 7 and 8 operate in the same manner as the conventional oscillation circuit shown in FIG. 3. However, with the oscillation circuits shown in FIGS. 7 and 8, the oscillation operating current always flows through the MOS transistor 24-2 for the constant current source and is thus kept constant. Consequently, the charge on the capacitor 50 does not change regardless of variation in the power source voltage $V_D$. Thus the oscillation frequency of the oscillation circuit is not affected.

Figure 10A:
FIGS. 10A, 10B and 10C are signal waveforms for explaining the operation of the oscillation circuit shown in FIG. 9.
Figure 10B:
Figure 10C:
Figure 9:
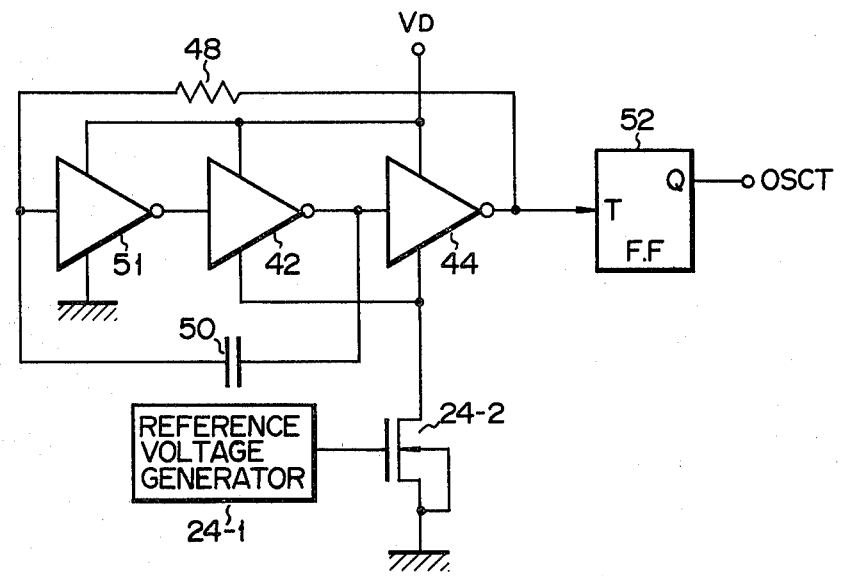
FIG. 9 is a circuit diagram of an oscillation circuit having a divider in accordance with still another embodiment of the present invention.

FIG. 9 shows an oscillation circuit in accordance with still another embodiment of the present invention. The oscillation circuit shown in FIG. 9 has a CR oscillation part which is substantially the same as that shown in FIG. 7, except that the inverter 51 whose operating current path is coupled between the power source terminal VD and ground is used in place of the inverter 40. In the CR oscillation part shown in FIG. 9, an oscillation signal of predetermined duty cycle, as shown in FIG. 10A, is generated when the power source voltage $V_D$ is normal. However, when the power source voltage $V_D$ decreases, the circuit threshold voltage of the inverter 51 and the circuit threshold voltage of the inverters 42 and 44 change relative to each other so that the duty cycle of the output signal of the CR oscillation circuit changes as shown in FIG. 10B. Thus, in this embodiment, a T-type flip-flop 52 for dividing the output signal of the CR oscillation part is used for generating an output signal which constantly hs a 50% duty cycle as shown in FIG. 10C.

Figure 11:
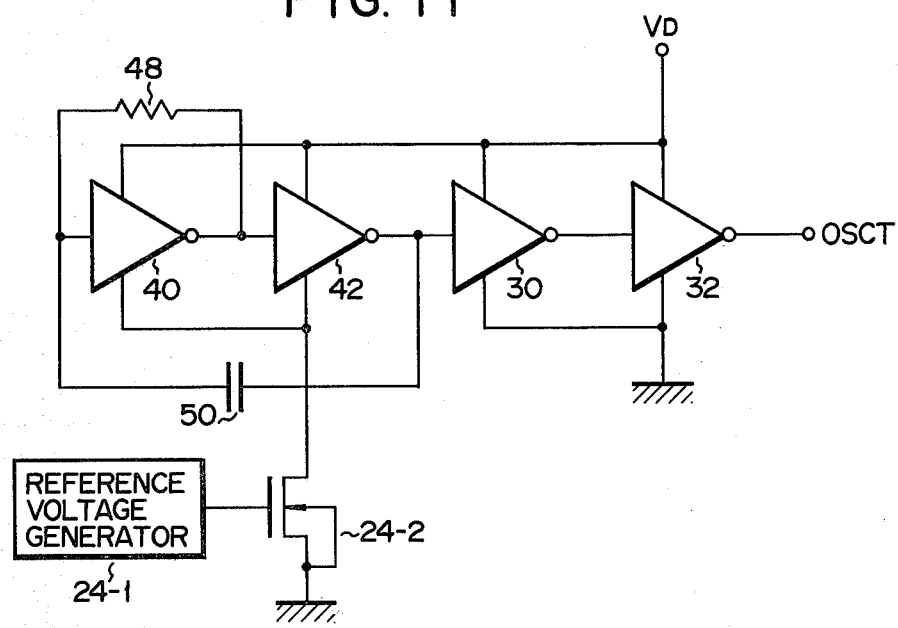
FIG. 11 is a circuit diagram of an oscillation circuit including a series circuit of a resistor and a capacitor in accordance with still another embodiment of the present invention.

FIG. 11 shows a CR oscillation circuit in accordance with still another embodiment of the present invention. The oscillation circuit shown in FIG. 11 has a CR oscillation circuit of substantially the same construction as that shown in FIG. 7, except that the inverter 44 is eliminated and a resistor 48 is connected between the the input and output terminals of the inverter 40. The oscillation circuit shown in FIG. 11 operates in substantially the same manner and provides the same effects as that shown in FIG. 7.

FIG. 12 shows a modification of the oscillation circuit shown in FIG. 7. The oscillation circuit shown in FIG. 12 is substantially the same as that shown in FIG. 7 except that a buffer amplifier including two inverters 60 and 62 which are connected in series, is coupled between the output terminal of the inverter 44 and the input terminal of the inverter 30. In the circuit shown in FIG. 12, one end of the capacitor 50 may be coupled to the output terminal of the inverter 60 instead of being coupled to the output terminal of the inverter 42. The insertion of the buffer amplifier results in steep leading and trailing edges of the oscillation output signal generated by the CR oscillation part.

FIG. 13 shows a modification of the oscillation circuit show in FIG. 9. The oscillation circuit shown in FIG. 13 is substantially the same as that shown in FIG. 9, except that a buffer amplifier including two inverters 70 and 72 which are connected in series is coupled between the output terminal of the inverter 51 and the input terminal of the inverter 42. In this case, the leading and trailing edges of the output signal of the inverter 51 also become steep, and an output signal whose waveform is shaped is obtained.

Figure 14:
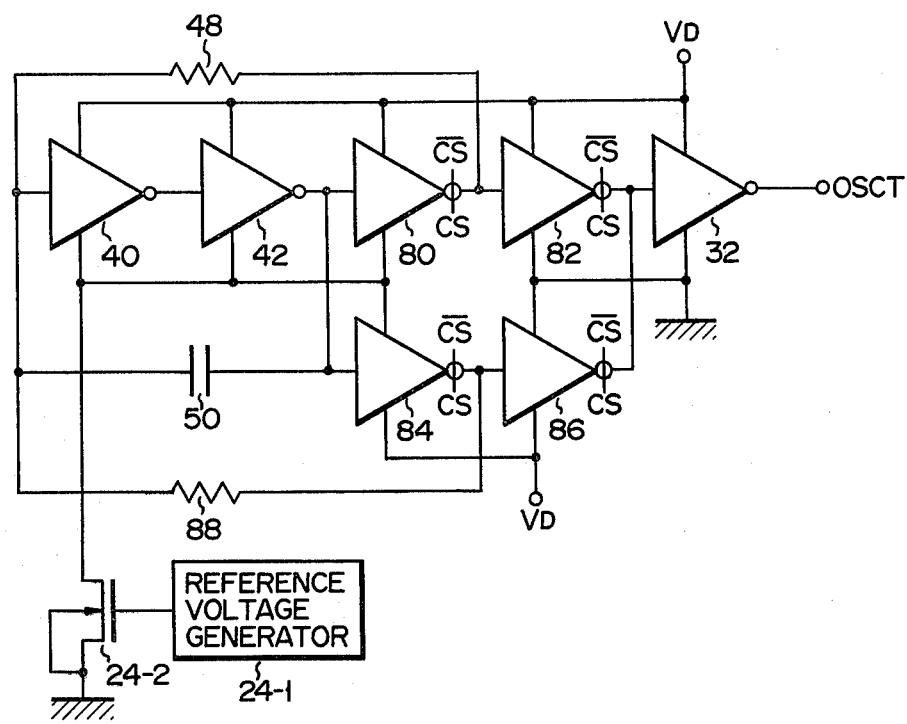
FIG. 14 is a circuit diagram of an oscillation circuit in accordance with the present invention which is capable of varying the oscillation frequency.

FIG. 14 shows a CR oscillation circuit in accordance with still another embodiment of the present invention. The oscillation circuit shown in FIG. 14 is substantially the same as that shown in FIG. 7, except that the inverters 44 and 30 are eliminated, clocked inverters 80 and 82 are connected in series between the output terminal of the inverter 42 and the input terminal of the inverter 32, clocked inverters 84 and 86 are connected in series between the output terminal of the inverter 42 and the input terminal of the inverter 32, and a resistor 88 is connected between the output terminal of the inverter 84 and the input terminal of the inverter 40.

Figure 15:
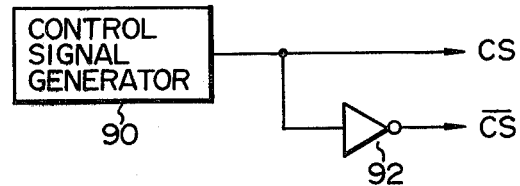
FIG. 15 is a circuit diagram of a control signal generating circuit used for varying the oscillation frequency in the oscillation circuit shown in FIG. 14.

In the oscillation circuit shown in FIG. 14, control signals CS and $\overline{CS}$ generated from a control signal generating circuit having a control signal generator 90 and an inverter 92 shown, for example, in FIG. 15. These signals are supplied to the clock terminals of the clocked inverters 80, 82, 84 and 86. For example, when a high level signal is generated by the control signal generator 90, the clocked inverters 80 and 82 are activated and the clocked inverters 84 and 86 are deactivated. Thus, in this case, the oscillation circuit shown in FIG. 14 operates in the same manner as the oscillation circuit shown in FIG. 7, and the oscillation output signal having an oscillation frequency which is determined by the resistor 48 and the capacitor 50 is generated.

When a low level signal is generated by the control signal generator 90, the clocked inverters 84 and 86 are activated and the clocked inverters 80 and 82 are deactivated. In this case, this oscillation circuit also operates in the same manner as that shown in FIG. 7, but the oscillation frequency is determined by the time constant which is defined by the resistor 88 and the capacitor 50. Thus, the oscillation circuit shown in FIG. 14 generates oscillation signals of different frequencies in response to the control signals from the control signal generator 90.

Figure 16:
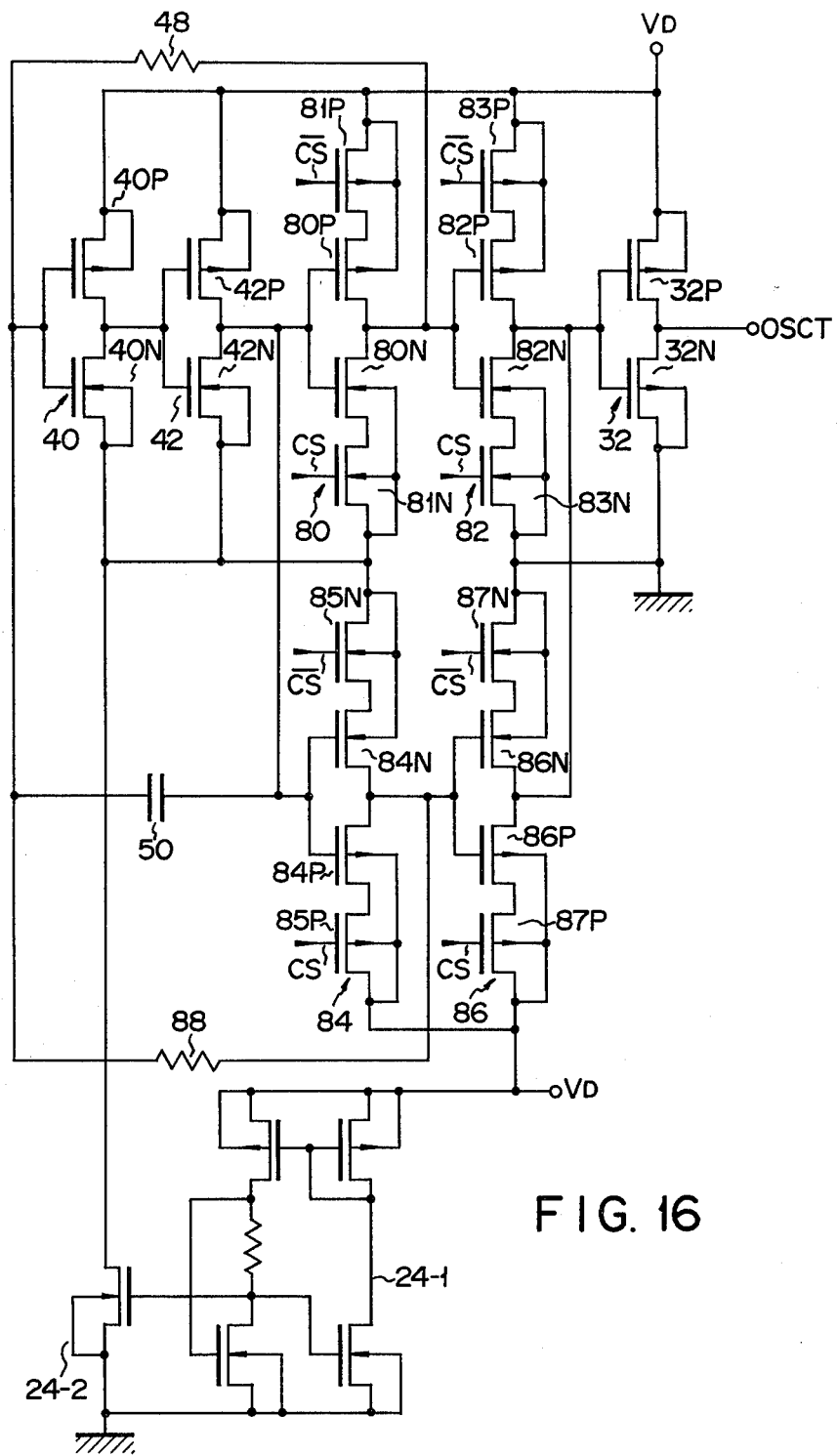
FIG. 16 is a circuit diagram of a practical example of the oscillation circuit shown in FIG. 14.

FIG. 16 shows a practical example of an MOS FET circuit of the oscillation circuit shown in FIG. 14. As may be apparent from the control shown in FIG. 16, the inverters 40, 42 and 32 are formed of the CMOS transistors 40P and 40N, 42P and 42N, and 32P and 32N, respectively. The clocked inverter 80 has p— and n— channel MOS transistors 80P and 80N whose gates are coupled to the output terminal of the inverter 42 and whose current paths are coupled in series with each other; a p— channel MOS transistor 81P whose gate receives a control signal CS and whose current path is coupled between the power source terminal $V_D$ and the MOS transistor 80P; and an n— channel transistor 81N whose gate receives a control signal CS and whose current path is coupled in series with the current path of the MOS transistor 80N. The other clocked inverters 82, 84 and 86 are constructed in the same manner as the clocked inverter 80. Thus, the clocked inverter 82 has p— channel MOS transistors 82P and 83P whose current paths are connected in series, and n— channel MOS transistors 82N and 83N; the clocked inverter 84 has p— channel MOS transistors 84P and 85P whose current paths are connected in series, and n— channel MOS transistor 84N and 84N; and the clocked inverter 86 has p— channel MOS transistors 86P and 87P whose current paths are connected in series, and n— channel MOS transistors 86N and 87N.

When a control signal CS of high level and a control signal $\overline{CS}$ of low level are generated from the control signal generating circuit shown in FIG 15, the MOS transistors 81P, 81N, 83P and 83N of the inverters 80 and 82 are all rendered conductive, and the MOS transistors 85P, 85N, 87P and 87N of the inverters 84 and 86 are all rendered nonconductive. The inverters 84 and 86 are deactivated and the inverters 80 and 82 execute an inverting operation. When a control signal CS of low level and a control signal $\overline{CS}$ of high level are generated from the control signal generating circuit, the MOS transistor 81P, 81N, 83P and 83N are rendered nonconductive, and the MOS transistors 85P, 85N, 87P and 87N are rendered conductive. Thus, the inverters 80 and 82 are deactivated, and the inverters 84 and 86 execute an inverting operation.

Figure 17:
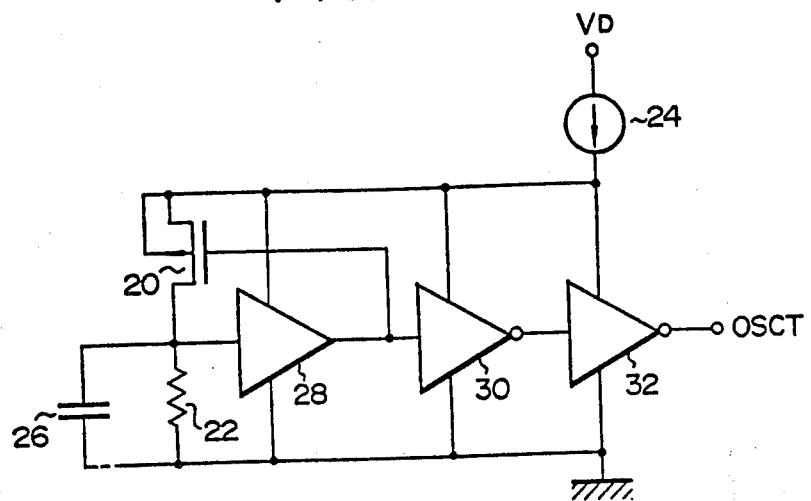
FIGS. 17 and 18 are views illustrating modifications of the oscillation circuit shown in FIG. 5.
Figure 18:
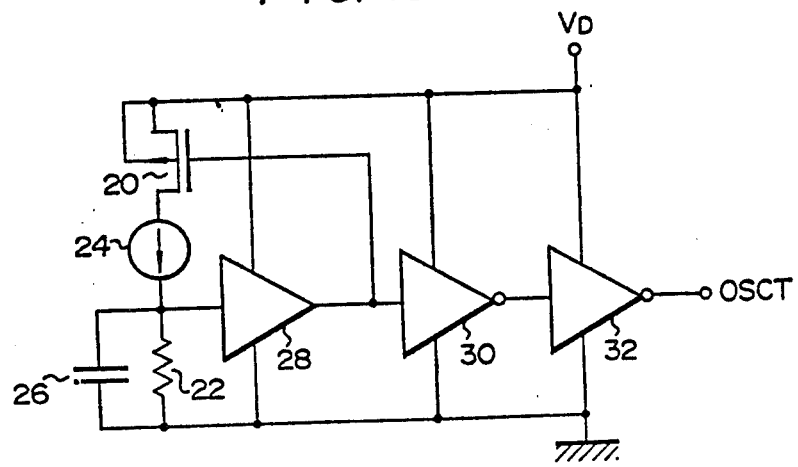

Although the present invention has been described with particular reference to the above embodiments, the present invention is by no means limited to the above particular embodiments. For example, in the oscillation circuits shown in FIGS. 5 and 6, the constant current source 25 may be connected, for example, as shown in FIGS. 17 and 18, since it suffices that the constant current source 24 be connected in series with the resistor 22 between the power source terminal $V_D$ and ground.

Figure 19:
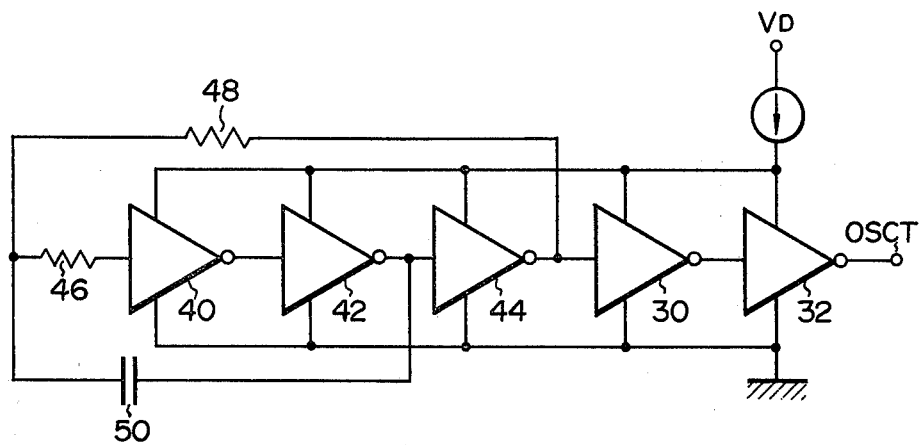
FIGS. 19 and 20 are views illustrating modifications of the oscillation circuit shown in FIG. 7.
Figure 20:
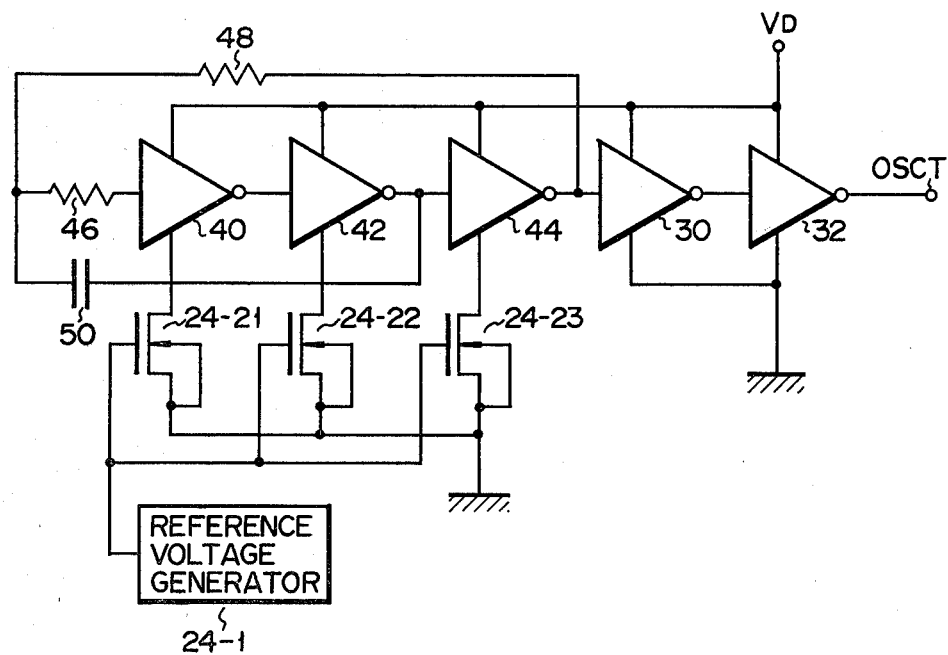

In the embodiment shown in FIG. 7, instead of connecting the constant current source 24 between the operating current path of the inverters 40, 42 and 44 and ground, it may be connected between the power source terminal $V_D$ and the positive biasing terminals of the inverters 30, 32, 40, 42 and 44 as shown in FIG. 19. It is further possible to construct the constant current source 24, as shown in FIG. 20, with the reference voltage generator 24-1 and MOS transistors 24-21 to 24-23 having current paths connected to the negative biasing terminals of the inverters 40, 42 and 44.

The conductivity type of the MOS transistor 24-2 for constituting the constant current source 24 may be freely set according to the output voltage of the reference voltage generator.

What we claim is:

1. An oscillation circuit comprising:
   a CR oscillation section including first and second power source terminals;
   an odd number of inverters coupled to said power source terminals, one of said inverters being a first inverter and another of said inverters being a final inverter, each of said inverters having an input terminal, an output terminal, and first and second biasing terminals, said inverters being connected in series such that, except for said first inverter, the input terminal of an inverter is connected to the output terminal of another inverter and the output terminal of said final inverter is not connected to the input terminal of another inverter.
   resistive means connected between the output terminal of an odd-numbered inverter in said inverter series and the input terminal of said first inverter, and
   capacitive means connected between the output terminal of an even-numbered inverter in said inverter series and the input terminal of said first inverter; and
   a constant current source means connected in series with the current path between the first and second biasing terminals of at least one of said inverters.

2. An oscillation circuit according to claim 1 wherein said resistive means is connected between the output terminal of said final inverter and the input terminal of said first inverter.

3. An oscillation circuit according to claim 2, wherein the first biasing terminals of said inverters are commonly connected and the second biasing terminals thereof are commonly connected.

4. An oscillation circuit according to claim 3, further comprising a waveform shaping circuit connected to the output terminal of said final inverter.

5. An oscillation circuit according to claim 3, wherein said constant current source means is connected between the first power source terminal and the first biasing terminals of said inverters and the second power source terminal is coupled to said second biasing terminals.

6. An oscillation circuit according to claim 2, wherein said inverters comprise CMOS transistors.

7. An oscillation circuit according to claim 2, wherein the first biasing terminals of said inverters are commonly connected, and the second biasing terminal of said first inverter is connected to the second power source terminal, and the second biasing terminals of all but said first inverter are commonly connected.

8. An oscillation circuit according to claim 7, further comprising a frequency divider connected to the output terminal of said final inverter.

9. An oscillation circuit according to claim 7, wherein said constant current source means is connected between the first power source terminal and the first biasing terminals of said inverters.

10. An oscillation circuit according to claim 2, wherein the first biasing terminals of said inverters are commonly connected, and said constant current source means has at least two constant current sources connected between said second power source terminal and the second biasing terminals of all of said inverters except said first inverter.

11. An oscillation circuit comprising:
    first and second power source terminals;
    a first inverter having first and second biasing terminals coupled, respectively, to said first and second power source terminals, an input terminal and an output terminal;
    a second inverter having first and second biasing terminals, an output terminal and an input terminal, said input terminal of said second inverter being connected to said output terminal of said first inverter;
    resistive means connected between said input terminal and said output terminal of said first inverter;
    capacitive means connected between the output terminal of said second inverter and the input terminal of said first inverter; and
    constant current source means connected in series with the first and second biasing terminals of at least one of said first and second inverters.

12. An oscillation circuit according to claim 11, wherein the first biasing terminals of said inverters are commonly connected, and the second biasing terminals thereof are commonly connected.

13. An oscillation circuit according to claim 12, wherein said constant current source means is connected between a first power source terminal and the first biasing terminals of said inverters.

* * * * *